(12) United States Patent
Wang et al.

(10) Patent No.: US 9,960,141 B2
(45) Date of Patent: *May 1, 2018

(54) BINDING WIRE AND SEMICONDUCTOR PACKAGE STRUCTURE USING THE SAME

(71) Applicant: Beijing FUNATE Innovation Technology Co., LTD., Beijing (CN)

(72) Inventors: Yu-Quan Wang, Beijing (CN); Li Qian, Beijing (CN)

(73) Assignee: Beijing FUNATE Innovation Technology Co., LTD., Beijing (CN)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/693,892

(22) Filed: Apr. 23, 2015

(65) Prior Publication Data

US 2015/0311174 A1 Oct. 29, 2015

(30) Foreign Application Priority Data

Apr. 23, 2014 (CN) .......................... 2014 1 0165198

(51) Int. Cl.
*H01L 21/00* (2006.01)
*H01L 23/49* (2006.01)
(Continued)

(52) U.S. Cl.
CPC .............. *H01L 24/49* (2013.01); *H01L 23/04* (2013.01); *H01L 21/02603* (2013.01);
(Continued)

(58) Field of Classification Search
CPC . H01L 2221/1094; H01L 23/49; H01L 23/52; H01L 24/42; H01L 24/44–24/49; H01L 21/02603; H01L 21/4825; H01L 21/4853; H01L 21/4885; H01L 21/4889; H01L 29/413
(Continued)

(56) References Cited

U.S. PATENT DOCUMENTS 7,551,433 B2 * 6/2009 Hammer ................. G06F 1/187
361/679.36
8,318,295 B2 11/2012 Wang et al.
(Continued)

FOREIGN PATENT DOCUMENTS

CN 2178579 10/1994
CN 101437663 5/2009
(Continued)

*Primary Examiner* — David Zarneke
(74) *Attorney, Agent, or Firm* — ScienBiziP, P.C.

(57) ABSTRACT

A semiconductor package structure includes a substrate, and a package preform. The substrate includes a plurality of conductive tracing wires. The package preform includes a semiconductor chip and a plurality of binding wires. The semiconductor chip includes a plurality of welding spots, and the welding spots are electrically connected with corresponding conductive tracing wires by the binding wires. Each binding wire comprises a carbon nanotube composite wire, the carbon nanotube composite wire includes a carbon nanotube wire and a metal layer. The carbon nanotube wire consists of a plurality of carbon nanotubes spirally arranged along an axial direction an axial direction of the carbon nanotube wire.

10 Claims, 4 Drawing Sheets

(51) Int. Cl.
*H01L 23/52* (2006.01)
*H01L 23/00* (2006.01)
*H01L 21/02* (2006.01)
*H01L 21/48* (2006.01)
*H01L 29/41* (2006.01)
*H01L 23/04* (2006.01)
*H01L 23/552* (2006.01)

(52) U.S. Cl.
CPC ...... *H01L 21/4825* (2013.01); *H01L 21/4853* (2013.01); *H01L 21/4885* (2013.01); *H01L 21/4889* (2013.01); *H01L 23/49* (2013.01); *H01L 23/52* (2013.01); *H01L 23/552* (2013.01); *H01L 24/42* (2013.01); *H01L 24/44* (2013.01); *H01L 24/45* (2013.01); *H01L 24/46* (2013.01); *H01L 24/47* (2013.01); *H01L 24/48* (2013.01); *H01L 29/413* (2013.01); *H01L 2221/1094* (2013.01); *H01L 2224/05554* (2013.01); *H01L 2224/05599* (2013.01); *H01L 2224/45015* (2013.01); *H01L 2224/4556* (2013.01); *H01L 2224/45144* (2013.01); *H01L 2224/45193* (2013.01); *H01L 2224/45541* (2013.01); *H01L 2224/45639* (2013.01); *H01L 2224/45644* (2013.01); *H01L 2224/45647* (2013.01); *H01L 2224/48091* (2013.01); *H01L 2224/85399* (2013.01); *H01L 2924/01006* (2013.01); *H01L 2924/15312* (2013.01); *H01L 2924/181* (2013.01); *H01L 2924/206* (2013.01); *H01L 2924/2064* (2013.01); *H01L 2924/2075* (2013.01); *H01L 2924/20751* (2013.01); *H01L 2924/20752* (2013.01); *H01L 2924/20753* (2013.01)

(58) Field of Classification Search
USPC .................................. 977/762, 765, 768, 932
See application file for complete search history.

(56) References Cited

U.S. PATENT DOCUMENTS

| | | | | |
|---|---|---|---|---|
| 8,614,120 | B2* | 12/2013 | Yang | H01L 23/552 257/659 |
| 8,664,751 | B2* | 3/2014 | Kim | H01L 23/552 257/659 |
| 8,680,677 | B2* | 3/2014 | Wyland | B82Y 10/00 257/690 |
| 8,772,953 | B2* | 7/2014 | Taya | H01L 21/56 257/790 |
| 8,813,354 | B2* | 8/2014 | Wu | H01L 23/552 29/830 |
| 8,946,886 | B1* | 2/2015 | Fuentes | H01L 23/552 257/678 |
| 9,123,718 | B1* | 9/2015 | Foster | H01L 21/56 |
| 9,379,035 | B1* | 6/2016 | Ge | H01L 23/367 |
| 9,570,208 | B2* | 2/2017 | Qian | H01B 1/04 |
| 2007/0296323 | A1* | 12/2007 | Liu | B82Y 10/00 313/311 |
| 2008/0170982 | A1 | 7/2008 | Zhang et al. | |
| 2011/0051447 | A1 | 3/2011 | Lee | |
| 2011/0095237 | A1 | 4/2011 | Liu et al. | |
| 2011/0155713 | A1 | 6/2011 | Wang et al. | |
| 2015/0061095 | A1* | 3/2015 | Choi | H01L 24/20 257/675 |

FOREIGN PATENT DOCUMENTS

| | | |
|---|---|---|
| CN | 101633500 | 1/2010 |
| CN | 101976594 | 2/2011 |
| CN | 102040212 | 5/2011 |
| CN | 10211926 | 6/2011 |
| CN | 103276486 | 9/2013 |
| CN | 203178958 | 9/2013 |
| TW | 200939249 | 9/2009 |
| TW | 201241843 | 10/2012 |

* cited by examiner

BINDING WIRE AND SEMICONDUCTOR PACKAGE STRUCTURE USING THE SAME

CROSS-REFERENCE TO RELATED APPLICATIONS

This application claims all benefits accruing under 35 U.S.C. § 119 from China Patent Application No. 201410165198.9, field on Apr. 23, 2014 in the China Intellectual Property Office, disclosure of which is incorporated herein by reference. The application is also related to copending applications entitled, "CARBON NANOTUBE COMPOSITE WIRE", filed Apr. 23, 2015 Ser. No. 14/693,893; "HOT WIRE ANEMOMETER", filed Apr. 23, 2015 Ser. No. 14/693,894; "DEFROSTING GLASS, DEFROSTING LAMP AND VEHICLE USING THE SAME", filed Apr. 23, 2015 Ser. No. 14/693,895; "WIRE CUTTING ELECTRODE AND WIRE CUTTING DEVICE USING THE SAME", filed Apr. 23, 2015 Ser. No. 14/693,897; "CONDUCTIVE MESH AND TOUCH PANEL USING THE SAME", filed Apr. 23, 2015 Ser. No. 14/693,898; "ELECTROMAGNETIC SHIELDING MATERIAL AND CLOTHING USING THE SAME", filed Apr. 23, 2015 Ser. No. 14/693,899; "MASS FLOWMETER", filed Apr. 23, 2015 Ser. No. 14/693,901.

FIELD

The disclosure generally relates to a binding wire, and a semiconductor package structure using the binding wire.

BACKGROUND

Semiconductor chips only have welding spots for a package, so they cannot be directly applied to an actual circuit. Additionally, semiconductor chips are easily affected by an external environment temperature, impurities and physical force, thus they are easily damaged. Therefore, semiconductor chips must be enclosed in a confined space, and require corresponding lead out pins.

A semiconductor chip package can solve the above problems, by bonding welding spots and package pins with a bonding wire, and wrapping the semiconductor chips except pins with a high strength protective layer.

BRIEF DESCRIPTION OF THE DRAWING

Implementations of the present technology will now be described, by way of example only, with reference to the attached figures.

DETAILED DESCRIPTION

Figure 1:
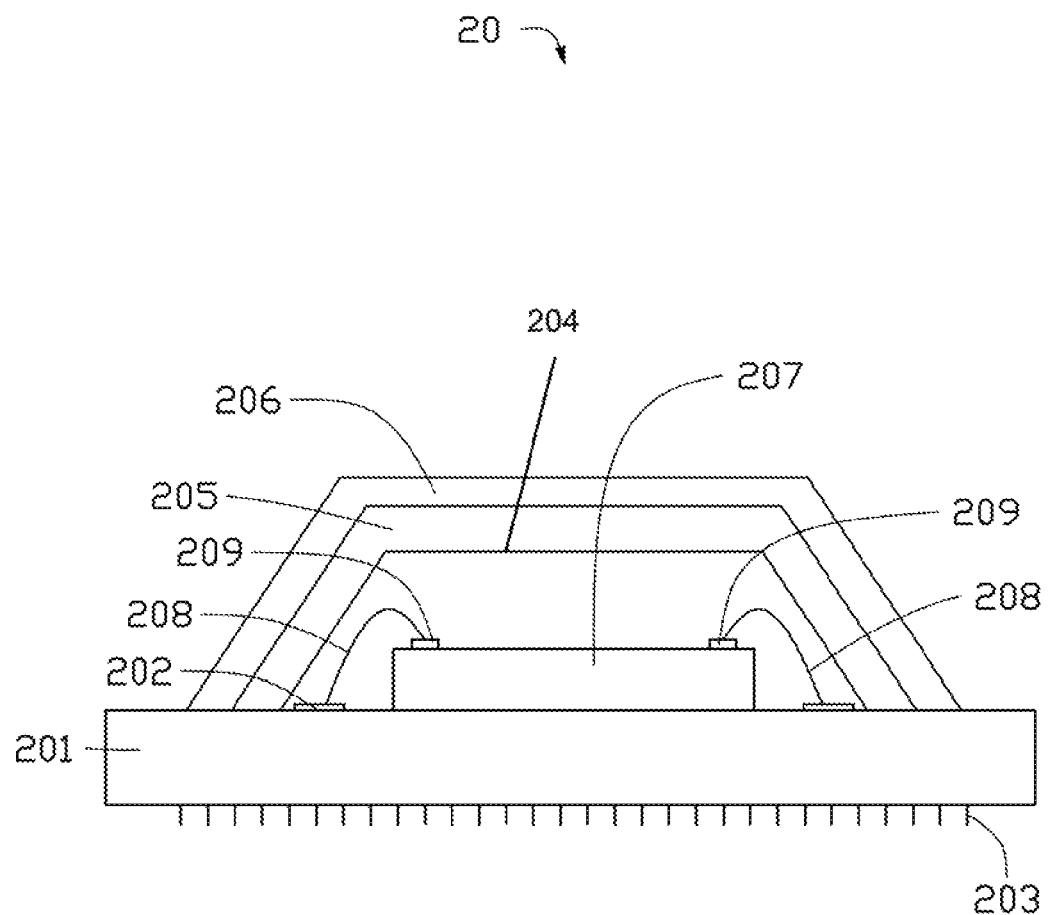
FIG. 1 is a side structure view of one embodiment of a semiconductor package structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Figure 2:
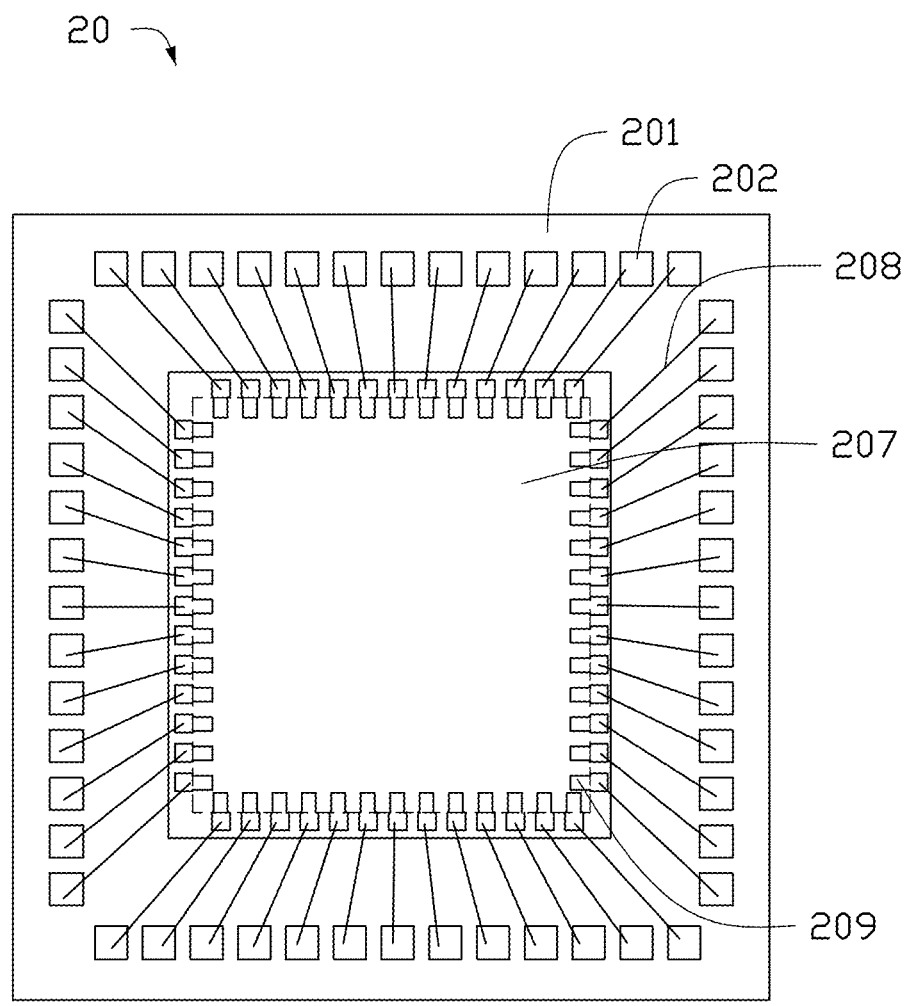
FIG. 2 is an overlooking structure view of one embodiment of a semiconductor package structure.

FIG. 1 and FIG. 2 illustrates a first embodiment of a semiconductor package structure 20 includes a substrate 201, a package preform 204 located on the substrate 201, a shielding layer 205 located on the package preform 204 and covering the package preform 204, and a protective layer 206 covering the shielding layer 205. The substrate 201 includes a plurality of conductive tracing wires 202, and a plurality of pins 203 connected with the plurality of conductive tracing wires. The package preform 204 includes a semiconductor chip 207 and a plurality of binding wires 208. The semiconductor chip 207 includes a plurality of welding spots 209 located on a surface of the semiconductor chip 207. The plurality of welding spots 209 and corresponding conductive tracing wires (not shown) located on the substrate 201 are electrically connected by the plurality of binding wires 208.

The substrate 201 can be a copper-clad laminate. A thickness and a size of the copper-clad laminate are not limited and can be selected according to need. The plurality of conductive tracing wires 202, arranged regularly, is formed on a first surface of the substrate 201. The plurality of pins 203 is located on a second surface of the substrate 201, and the second surface is opposite to the first surface. The semiconductor chip 207 is electrically connected to an external circuit by the plurality of pins 203.

The semiconductor chip 207 can be storage devices, such as RAM and DRAM; or other electronic components. A size of the semiconductor chip 207 is not limited and can be selected according to need.

Figure 3:
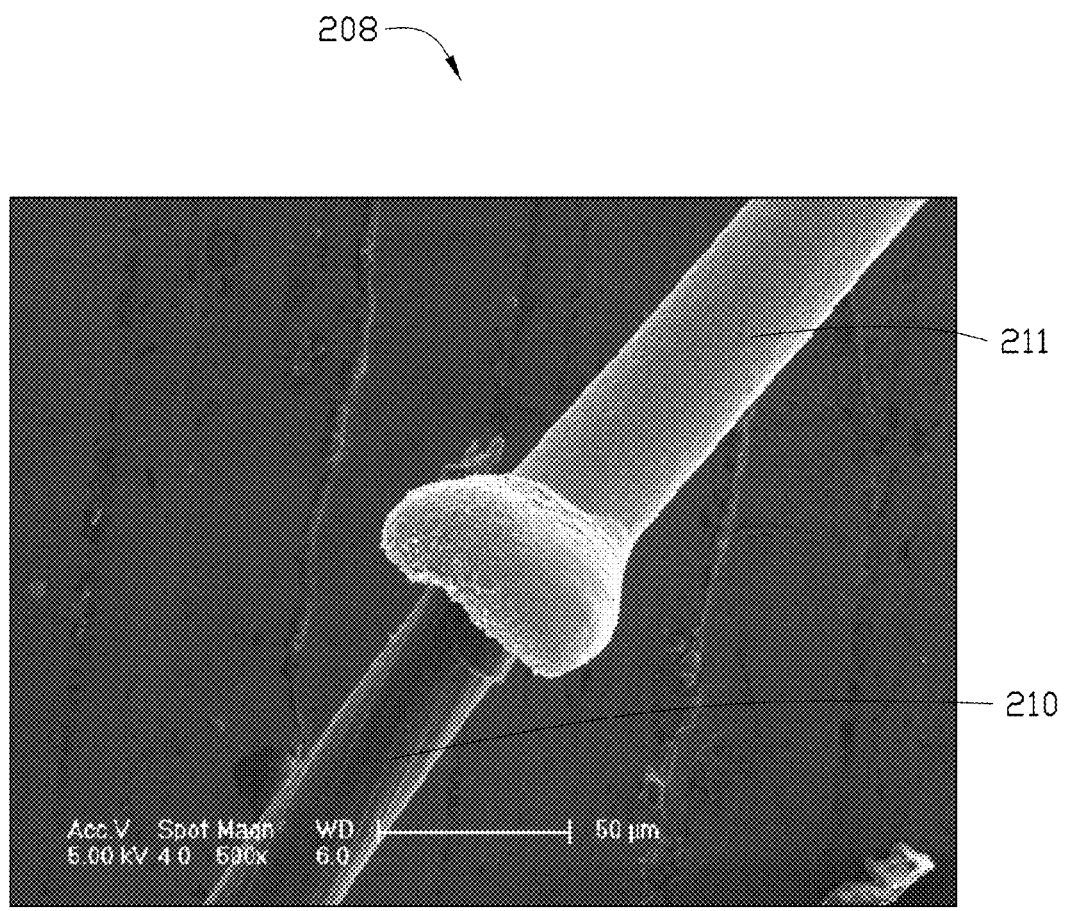
FIG. 3 shows a Scanning Electron Microscope image of an embodiment of a carbon nanotube composite wire.

FIG. 3 illustrates the binding wire 208 includes a carbon nanotube composite wire. In one embodiment, the binding wire 208 consists of a carbon nanotube composite wire. The carbon nanotube composite wire includes a carbon nanotube wire 210 and a metal layer 211 coated on an outer surface of the carbon nanotube wire 210. In one embodiment, the carbon nanotube wire 210 includes a plurality of carbon nanotubes spirally arranged along an axial direction of the carbon nanotube wire 210. The plurality of carbon nanotubes are secured together by van der Waals attractive force. A first end of the binding wire 208 is welded at the welding spots 209, and a second end of the binding wire 208 is welded at the conductive tracing wires 202; thus, the semiconductor chip 207 can be electrically connected to the corresponding conductive tracing wires 202.

The carbon nanotube wire 210 includes a plurality of carbon nanotubes twisted with each other. The carbon nanotube wire 210 can be formed by twisting a carbon nanotube film. The carbon nanotube film can be drawn from a carbon nanotube array. The carbon nanotube film includes a plurality of carbon nanotubes parallel with each other. In one embodiment, the carbon nanotube film can be twisted clockwise to form an S-twist; in another embodiment, the carbon nanotube film can be twisted counterclockwise direction to form a Z-twist. The plurality of carbon nanotubes in the carbon nanotube film are substantially oriented along an axial direction of the carbon nanotube film, and joined end-to-end by van der Waals force in the axial direction of the carbon nanotube film. Therefore when the carbon nanotube film is twisted, the plurality of carbon nanotubes in the carbon nanotube wire 210 are spirally arranged along an axial direction of the carbon nanotube wire 210, in an end to end arrangement by van der Waals forces, and extends in a same direction.

During the twisting process of the carbon nanotube film, a space between adjacent carbon nanotubes becomes smaller along a radial direction of the carbon nanotube wire 210, and a contact area between the adjacent carbon nanotubes becomes larger along the radial direction of the carbon nanotube wire 210. Therefore, van der Waals attractive force between adjacent carbon nanotubes along the radial direction of the carbon nanotube wire 210 significantly increases, and adjacent carbon nanotubes in the carbon nanotube wire 210 are closely connected. In one embodiment, the space between adjacent carbon nanotubes along the radial direction of the carbon nanotube wire 210 is less than or equal to 10 nanometers. In one embodiment, the space between adjacent carbon nanotubes along the radial direction of the carbon nanotube wire 210 is less than or equal to 5 nanometers. In one embodiment, the space between adjacent carbon nanotubes along the radial direction of the carbon nanotube wire 210 is less than or equal to 1 nanometer. Since the space between adjacent carbon nanotubes in the radial direction of the carbon nanotube wire 210 is small, and adjacent carbon nanotubes are closely connected by van der Waals force; the carbon nanotube wire 210 includes a smooth and dense surface.

A diameter of the carbon nanotube wire 210 can range from about 1 micron to about 30 microns. A twist of the carbon nanotube wire 210 can range from about 10 r/cm to about 300 r/cm. The twist of the carbon nanotube wire 210 refers to the number of turns per unit length of the carbon nanotube wire 210. When the diameter of the carbon nanotube wire 210 is constant, an appropriate twist can give the carbon nanotube wire 210 excellent mechanical properties. When the diameter of the carbon nanotube wire 210 is less than 10 microns, the twist of the carbon nanotube wire 210 ranges from about 250 r/cm to about 300 r/cm. When the diameter of the carbon nanotube wire 210 ranges from about 10 microns to about 20 microns, the twist of the carbon nanotube wire 210 ranges from about 200 r/cm to about 250 r/cm. When the diameter of the carbon nanotube wire 210 ranges from about 25 microns to about 30 microns, the twist of the carbon nanotube wire 210 ranges from about 100 r/cm to about 150 r/cm.

Since the carbon nanotube wire 210 includes a smooth and dense surface, the metal layer 211 and the carbon nanotube wire 210 can form a close bond, thus, the metal layer 211 is not easily detached from the carbon nanotube wire 210. The metal layer 211 is uniformly coated on the outer surface of the carbon nanotube wire 210. A thickness of the metal layer 211 ranges from about 1 micron to about 5 microns. When the thickness of the metal layer 211 ranges from about 1 micron to about 5 microns, a conductivity of the carbon nanotube composite wire can reach 50 percent or more of a conductivity of the metal layer 211. If the thickness of the metal layer 211 is too small, such as less than 1 micro, the conductivity of the carbon nanotube composite wire is not significantly increased; on the contrary, the metal layer 211 will be easily oxidized, and the conductivity and service life of the carbon nanotube composite wire will be further reduced. In addition, experiments show that when the thickness of the metal layer 211 is greater than a certain value, such as more than 5 micros, the conductivity of the carbon nanotube composite wire is not be significantly increased in proportion to an increase of the diameter and weight of the carbon nanotube composite wire. The mechanical strength of the carbon nanotube wire 210 is 5 to 10 times stronger than the mechanical strength of a gold wire of equal diameter. A material of the metal layer 211 can be selected from the group consisting of gold, silver, copper, molybdenum, and tungsten, other metals and their alloys having good electrical conductivity.

The metal layer 211 can be formed on the outer surface of the carbon nanotube wire 210 by a method such as plating, electroless plating, vapor plating.

Figure 4:
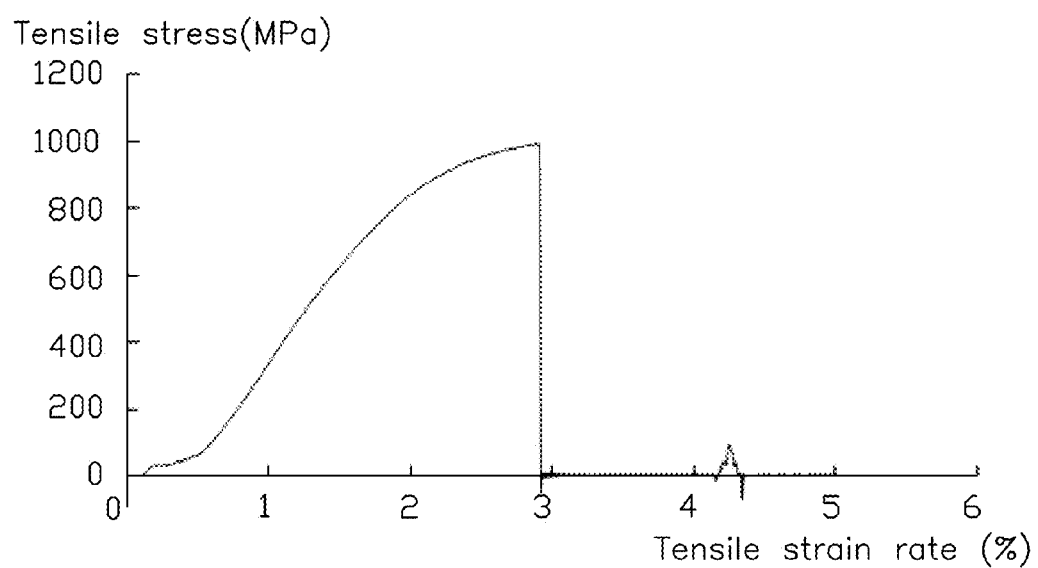
FIG. 4 shows a tensile stress curve of an embodiment of the carbon nanotube composite wire.

In one embodiment, the diameter of the carbon nanotube composite wire is about 35 micros, wherein the diameter of the carbon nanotube wire 210 is about 25 micros, and the twist of the carbon nanotube wire 210 is about 100 r/cm. The metal layer 211 is a copper layer, and a thickness of the copper layer is about 5 micros. FIG. 4 illustrates the tensile strength of the carbon nanotube composite wire is more than 900 MPa, which is about 5 times stronger than the tensile strength of the gold wire of the same diameter. FIG. 2 also shows that the tensile strain rate of the carbon nanotube composite wire is about 3%; and the conductivity of the carbon nanotube composite wire is about $4.39 \times 10^7$ S/m, which is about 75% of the conductivity of copper.

The shielding layer 205 can be a metal layer, such as a copper layer, an iron layer; an alloy layer, such as Fe—Ni alloy, Fe—Co alloy; or an organic material layer filled with porous metal particles.

According to one embodiment, a diameter of the binding wires 208 can be smaller, by controlling the diameter of the carbon nanotube wire 210 and the thickness the metal layer 211.

The first end of the binding wire 208 is welded at the welding spots 209 of the semiconductor chip 207, and the second end of the binding wire 208 is welded at the conductive tracing wires 202 of the substrate 201. In one embodiment, the binding wire 208 is first threaded on the middle of a ceramic cleaver, so that a part of the binding wire 208 is exposed from a front-end of the ceramic cleaver to form an exposed part. The exposed part is melted into a sphere by a high temperature produced by igniting an arcing rod of the ceramic cleaver. Then the ceramic cleaver is moved down to the welding spots 209, and a first spherical welding spot is formed by applying a certain pressure and ultrasound. The ceramic cleaver is moved up to draw the carbon nanotube composite wire to rise. Then the ceramic cleaver is moved down to the conductive tracing wires 202 to make the ceramic cleaver laterally gash and cut off the carbon nanotube composite wire. A second crescent or fishtail welding spot is formed. Finally, the ceramic cleaver is pulled and one operation is completed.

Compared with conventional binding wire, the binding wire 208, that is the carbon nanotube composite wire, has many advantages as follows:

The carbon nanotube composite wire has good mechanical properties and mechanical properties, by optimizing the diameter and the twist of the carbon nanotube wire 210, and the thickness of the metal layer 211.

Since a tensile strain rate of the carbon nanotube composite wire is less than or equal to 3%, the binding wire 208 is not easily broken; which can extend a life of the semiconductor chip 207.

Because the thickness of the metal layer 211 ranges from about 1 micron to about 5 microns, when the carbon nanotube composite wire is used, the metal layer 211 plays a major conductive role; because of a electrical skin effect, the current is mostly transmitted through a surface of the carbon nanotube composite wire, that is, current is mostly transmitted under and through the metal layer 211. Thus, the conductivity of the carbon nanotube composite wire is significantly increased, and the conductivity of the binding wire 208 is hardly affected; which can meet the requirements of the semiconductor chip 207.

The binding wire 208 can be used in a chip bonding of the semiconductor chip, including chips, IC circuit and so on.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A semiconductor package structure comprising:
    a substrate comprising a plurality of conductive tracing wires;
    a package preform comprising a semiconductor chip and a plurality of binding wires;
    a shielding layer covering the package preform; and
    a protective layer covering the shielding layer,
    wherein the semiconductor chip comprises a plurality of welding spots, and the plurality of welding spots are electrically connected with the plurality of conductive tracing wires via the plurality of binding wires; each of the plurality of binding wires comprises a carbon nanotube composite wire, and the carbon nanotube composite wire comprises a carbon nanotube wire and a metal layer coated on an outer surface of the carbon nanotube wire; the carbon nanotube wire comprises a plurality of carbon nanotubes spirally arranged along an axial direction of the carbon nanotube wire; a metal layer thickness ranges from about 1 micron to about 5 microns, a diameter of the carbon nanotube wire ranges from about 25 microns to about 30 microns, and a twist of the carbon nanotube wire ranges from about 100 r/cm to about 150 r/cm.

2. The semiconductor package structure of claim 1, wherein a carbon nanotube composite wire tensile strain rate is less than or equal to 3%.

3. The semiconductor package structure of claim 1, wherein a space between adjacent carbon nanotubes along a radial direction of the carbon nanotube wire is less than or equal to 10 nanometers.

4. The semiconductor package structure of claim 3, wherein the space between adjacent carbon nanotubes along the radial direction of the carbon nanotube wire is less than or equal to 5 nanometers.

5. The semiconductor package structure of claim 1, wherein the plurality of carbon nanotubes are secured together by van der Waals attractive force.

6. The semiconductor package structure of claim 1, wherein a material of the metal layer is gold, silver, or copper.

7. The semiconductor package structure of claim 1, wherein a mechanical strength of the carbon nanotube wire is 5 to 10 times stronger than a mechanical strength of a gold wire of equal diameter.

8. The semiconductor package structure of claim 1, wherein the thickness of the metal layer is about 5 micros, the diameter of the carbon nanotube wire is about 25 micros, and the twist of the carbon nanotube wire is about 100 r/cm.

9. The semiconductor package structure of claim 1, wherein a tensile strength of the carbon nanotube composite wire is larger than 900 MPa.

10. The semiconductor package structure of claim 1, wherein a conductivity of the carbon nanotube composite wire is about $4.39 \times 10^7$ S/m.

\* \* \* \* \*